(12) United States Patent
Foley et al.

(10) Patent No.: US 10,560,062 B2
(45) Date of Patent: *Feb. 11, 2020

(54) PROGRAMMABLE BIASING FOR PIN DIODE DRIVERS

(71) Applicant: MACOM Technology Solutions Holdings, Inc., Lowell, MA (US)

(72) Inventors: Brendan Foley, Co. Wexford (IE); Michelle Dowling, Co. Cork (IE); Chi Mo, Irvine, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,336

(22) Filed: Nov. 18, 2016

(65) Prior Publication Data

US 2018/0145681 A1 May 24, 2018

(51) Int. Cl.
| | |
|---|---|
| *H03B 1/00* | (2006.01) |
| *H03K 3/00* | (2006.01) |
| *H03F 3/19* | (2006.01) |
| *H03K 17/74* | (2006.01) |
| *H03F 3/195* | (2006.01) |
| *H03F 3/217* | (2006.01) |
| *H03F 3/24* | (2006.01) |
| *G05F 1/46* | (2006.01) |

(52) U.S. Cl.
CPC .............. *H03F 3/19* (2013.01); *H03F 3/195* (2013.01); *H03F 3/2173* (2013.01); *H03F 3/245* (2013.01); *H03K 17/74* (2013.01); *G05F 1/46* (2013.01); *H03F 2200/294* (2013.01); *H03F 2200/451* (2013.01)

(58) Field of Classification Search
CPC .................................. H03F 3/19; H03K 17/74
USPC ........................................................ 327/109
See application file for complete search history.

(56) References Cited

U.S. PATENT DOCUMENTS

| | | | |
|---|---|---|---|
| 5,367,268 A | 11/1994 | Baba | |
| 5,892,400 A | 4/1999 | van Saders et al. | |
| 6,424,232 B1 | 7/2002 | Mavretic et al. | |
| 6,972,628 B2 | 12/2005 | Eo et al. | |
| 7,109,801 B2 | 9/2006 | Li | |
| 7,746,156 B1 | 6/2010 | Massie et al. | |
| 8,026,636 B2 * | 9/2011 | Oh | G05F 1/46 307/31 |
| 10,110,218 B2 | 10/2018 | Foley et al. | |
| 2003/0015767 A1 | 1/2003 | Emrick et al. | |
| 2003/0102912 A1 | 6/2003 | Tripathi et al. | |
| 2005/0213354 A1 | 9/2005 | Pai | |
| 2007/0004343 A1 | 1/2007 | Kandola et al. | |

(Continued)

OTHER PUBLICATIONS

International Search Report and Written Opinion for Application No. PCT/US2017/048621 dated Nov. 30, 2017.

(Continued)

*Primary Examiner* — Metasebia T Retebo
(74) *Attorney, Agent, or Firm* — Wolf, Greenfield & Sacks, P.C.

(57) ABSTRACT

Driving circuitry is described that includes multiple programmable bias voltages useful for biasing radio-frequency components such as PIN diodes and gallium-nitride devices. Programmable voltages as high as 30 volts and as low as −20 volts are generated. The drive circuitry can operate from a single, low-voltage power source.

20 Claims, 3 Drawing Sheets

(56) References Cited

U.S. PATENT DOCUMENTS

| | | |
|---|---|---|
| 2008/0180176 A1 | 7/2008 | Lee |
| 2009/0108794 A1 | 4/2009 | Ochiai et al. |
| 2010/0073088 A1 | 3/2010 | Wimpenny et al. |
| 2011/0006846 A1 | 1/2011 | Miho et al. |
| 2011/0050036 A1 | 3/2011 | Gilardi |
| 2011/0181324 A1 | 7/2011 | Gesche et al. |
| 2011/0279185 A1 | 11/2011 | Lautzenhiser |
| 2013/0121044 A1 | 5/2013 | Gao et al. |
| 2013/0207726 A1 | 8/2013 | Tadano |
| 2014/0184334 A1 | 7/2014 | Nobbe et al. |
| 2015/0188496 A1 | 7/2015 | Kim |
| 2016/0134967 A1 | 5/2016 | Kwon |
| 2018/0061984 A1 | 3/2018 | Achiriloaie et al. |
| 2018/0145680 A1 | 5/2018 | Foley et al. |
| 2018/0145682 A1 | 5/2018 | Foley et al. |
| 2018/0358886 A1 | 12/2018 | Patterson et al. |

OTHER PUBLICATIONS

[No Author Listed], TPS6513x Positive and Negative Output DC-DC Converter. Texas Instruments. Jan. 2016. 33 pages.

U.S. Appl. No. 16/355,463, dated Mar. 15, 2019, Inventor Patterson et al.

U.S. Appl. No. 16/182,458, dated Nov. 6, 2018, Inventor Achiriloaie et al.

PCT/US2017/048621, dated Nov. 30, 2017, International Search Report and Written Opinion.

PCT/U52017/048621, dated Aug. 6, 2018, Written Opinion of the International Preliminary Examining Authority.

PCT/U52017/048621, dated Nov. 14, 2018, Written Opinion of the International Preliminary Examining Authority.

PCT/U52017/048621, dated Dec. 19, 2018, Ch. II International Preliminary Report on Patentability.

Written Opinion of the International Preliminary Examining Authority for International Application No. PCT/US2017/048621, dated Aug. 6, 2018.

Written Opinion of the International Preliminary Examining Authority for International Application No. PCT/US2017/048621, dated Nov. 14, 2018.

Ch. II International Preliminary Report on Patentability for International Application No. PCT/US2017/048621, dated Dec. 19, 2018.

[No Author Listed] M09000-14: LED Driver and PMIC for DLP/LCOS Pico Projectors. MACOM Technology Solutions, Inc. Publicly known prior to Nov. 18, 2016. 56 pages.

* cited by examiner

PROGRAMMABLE BIASING FOR PIN DIODE DRIVERS

BACKGROUND

Technical Field

The technology relates to driving circuitry for biasing radio-frequency components, such as PIN diodes and gallium-nitride devices.

Discussion of the Related Art

Semiconductor diodes with wide, intrinsic semiconductor regions between p-type and n-type semiconductor regions on either side of the diode junction are referred to as "PIN" diodes. PIN diodes can be used in radio-frequency (RF) applications as switches and/or attenuators, and may be used in other applications as photodetectors and photovoltaic cells. When a PIN diode is forward biased, the PIN diode becomes conductive and can readily pass an RF signal. Under forward bias, the PIN diode essentially appears as a short. When at zero bias or reverse bias, a PIN diode is mainly a capacitive element, since the intrinsic region of the diode is depleted of carriers, and may effectively block an RF signal. The capacitance of a PIN diode can be small (e.g., on the order of 1 pF or less). Because a PIN diode has small capacitance, it can be switched at high speed between conductive and capacitive states which makes it attractive for RF applications.

Gallium-nitride (GaN) amplifiers may include GaN transistors, such as high-electron mobility transistors (HEMTs), formed from gallium-nitride material. These amplifiers are useful for RF communications and radar applications because of their high-speed and high-breakdown-voltage capabilities. Gallium-nitride amplifiers may be biased with negative voltages as high as −20 volts in some cases (e.g., to prevent conduction) and also with high positive voltages.

SUMMARY

Structures and methods for dynamic, programmable biasing of PIN diodes and/or GaN devices are described. According to some embodiments, driving circuitry for PIN diodes and GaN devices may use only a single low-voltage supply (e.g., a 5-volt supply) and provide multiple, programmable voltage outputs as high as 30 volts and as low as −20 volts. In some implementations, a single-bit data line may be used to control the biasing of as many as three PIN diodes. In some embodiments, the PIN diodes may be assembled in a circuit within a same module as the driving circuitry, and configured to switch RF signals to and from an antenna for wireless communication applications. Programmability of output voltages allows the driving circuitry to be tailored to a specific application. Additionally, output voltages may be tuned on-the-fly or at set-up to improve performance of components biased by the driving circuitry.

Some embodiments relate to a driver circuit comprising a substrate on which the driver circuit is assembled, a supply voltage contact configured to receive electrical power from a power source, a boost converter connected to the supply voltage contact and configured to convert a first voltage received from the power source to a second voltage that is greater than the first voltage and to a third voltage that is less than the first voltage, and a low-dropout regulator configured to convert the second voltage to a fourth voltage. The driver circuit may further include a programmable register configured to receive a digital signal and output a first control signal responsive to the received digital signal that alters at least the fourth voltage within a positive voltage range that is greater than zero volts.

In some aspects, the positive voltage range is from approximately 15 volts to approximately 28 volts. The programmable register may be further configured to output a second control signal that alters the third voltage within a negative voltage range that is less than zero volts. In some aspects, the negative voltage range is from approximately −8 volts to approximately −20 volts.

In some implementations, the supply voltage contact is the only contact for receiving power that powers the driver circuit.

According to some aspects, the boost converter comprises, two transistors, two inductor contacts on the substrate that are connected to the two transistors, and switching circuitry configured to switch current through an inductor that attaches to the two inductor contacts. An input of the low-dropout regulator may be arranged to connect to a cathode of a diode having an anode that connects to the inductor.

In some implementations, the first voltage is between approximately 2.5 volts and approximately 7 volts. The fourth voltage may be less than the second voltage.

In some implementations, the driver circuit further comprises one or more bias drivers configured to receive a supply voltage from the low-dropout regulator and switch output bias voltages between two levels. The driver circuit may further comprise a TTL buffer configured to receive commands via a bias-control contact and activate or deactivate the one or more bias drivers. In some aspects, the TTL buffer is further configured to output an enable signal that indicates when at least one of the bias drivers is activated or deactivated.

According to some implementations, a bias driver of the one or more bias drivers comprises a first transistor having a drain connected to receive an output voltage from the low-dropout regulator, a first buffer configured to receive power from the low-dropout regulator, to be referenced to a reference voltage that is less than a voltage from the low-dropout regulator and greater than zero volts, and to drive a gate of the first transistor, a second transistor having a drain connected to a source of the first transistor, and a second buffer configured to drive a gate of the second transistor. The reference voltage may be between 2.5 volts and 7 volts less than a voltage received from the low-dropout regulator.

In some implementations, the driver circuit further comprises a first level shifter having an output connected to an input of the first buffer and a second level shifter having an output connected to an input of the second buffer.

According to some aspects, the driver circuit may further comprise plural PIN diodes assembled on the substrate and connected to the one or more bias drivers. The driver circuit may further comprise an antenna contact coupled to a node between a receive PIN diode and a transmit PIN diode of the plural PIN diodes, a receive contact coupled to a node between the receive PIN diode and a shunt PIN diode of the plural PIN diodes, and a transmit contact coupled to the transmit PIN diode, wherein the bias drivers are configured to bias the plural PIN diodes to switch RF signals between the receive contact and the transmit contact from or to the antenna contact. In some cases, the driver circuit may further comprise a low noise amplifier assembled on the substrate and connected to receive a signal from a cathode of the receive PIN diode and output an amplified signal to the receive contact.

According to some implementations, a driver circuit further comprises one or more gallium-nitride devices assembled on the substrate and connected to the one or more bias drivers. In some aspects, a gallium-nitride amplifier of the one or more gallium-nitride devices is arranged to receive a negative voltage bias from the third voltage.

Methods for biasing RF components are also described. A method for biasing radio-frequency components with a driver circuit may comprise acts of (1) receiving, at the driver circuit assembled on a substrate, a first supply voltage, (2) converting, with a boost converter assembled on the substrate, the first supply voltage to a second voltage that is greater than the first voltage, (3) converting, with the boost converter, the first supply voltage to a third voltage that is less than the first voltage, (4) reducing, with a low-dropout regulator assembled on the substrate, the second voltage to a fourth voltage, (5) providing the fourth voltage to one or more bias drivers that are assembled on the substrate, (6) receiving, at a programmable register assembled on the substrate, a digital signal, and (7) altering, responsive to receiving the digital signal and with a control signal from the programmable register, the fourth voltage from a first value to a second value within a positive voltage range that is greater than zero volts.

In some implementations, the first supply voltage is the only supply voltage received by the driver circuit.

In some aspects, converting the first supply voltage to the second voltage and converting the first supply voltage to the third voltage comprises switching two transistors to drive current through a single inductor. The first supply voltage may have a value between approximately 2.5 volts and approximately 7 volts and the second voltage may have a value between approximately 20 volts and approximately 35 volts. The third voltage may have a value between approximately −8 volts and approximately −20 volts.

In some implementations, a method for biasing RF components may further comprise acts of providing the fourth voltage to one or more bias drivers that are assembled on the substrate, and switching at least one of the bias drivers between a first state that outputs a first bias voltage and a second state that outputs a second bias voltage. A method may include applying bias voltages from the one or more bias drivers to bias one or more PIN diodes. A method may include switching RF signals responsive to biasing the one or more PIN diodes.

In some aspects, a method may further comprise applying bias voltages from the one or more bias drivers to bias one or more gallium-nitride devices. In some implementations, a method for biasing GaN devices may comprise applying a negative voltage from the third voltage to bias the one or more gallium-nitride devices.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate, for example. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Figure 1:
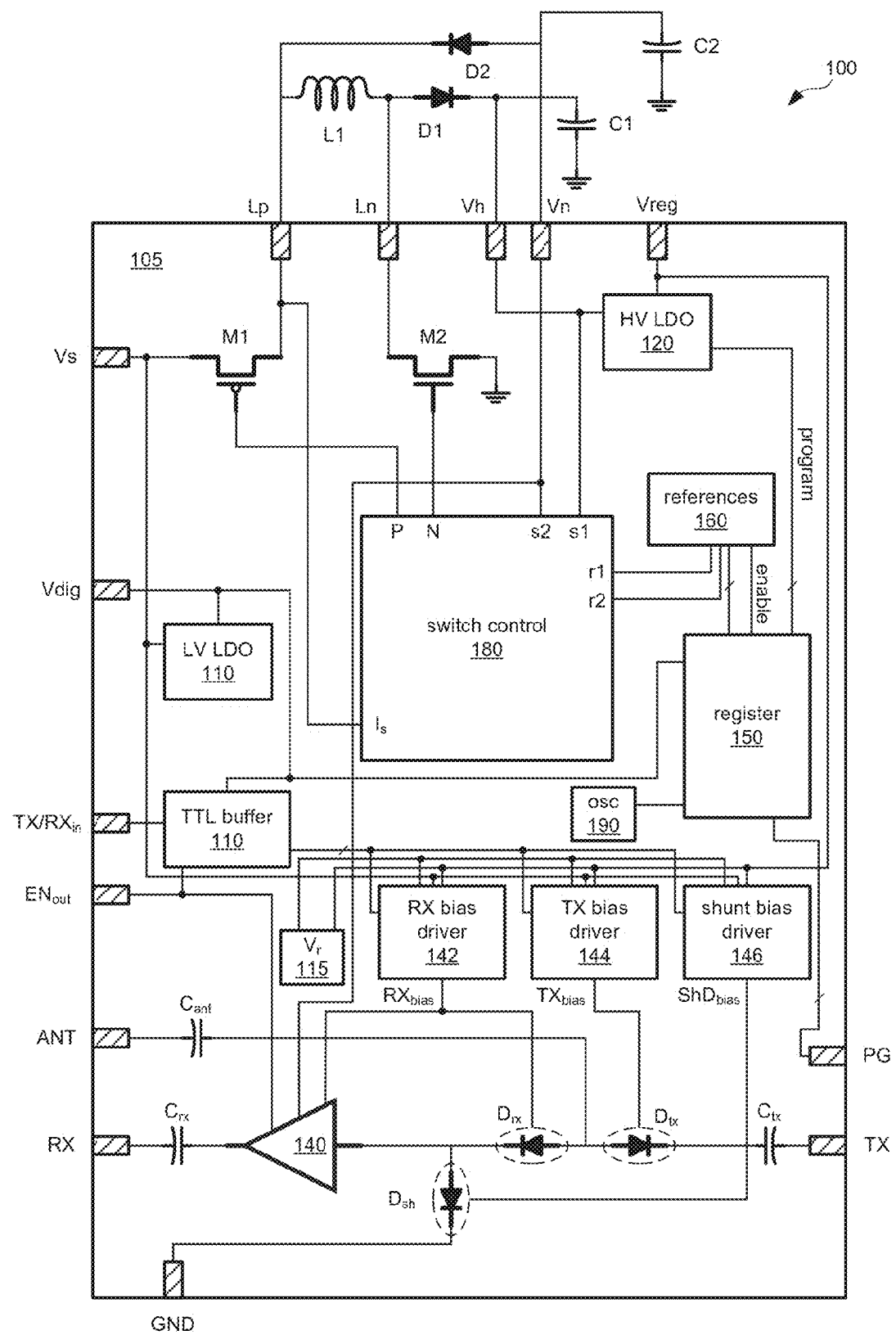
FIG. 1 depicts programmable driving circuitry and PIN diodes which may be assembled into a module powered by a single, low-voltage supply, according to some embodiments.

Features and advantages of the illustrated embodiments will become more apparent from the detailed description set forth below when taken in conjunction with the drawings.

DETAILED DESCRIPTION

Microwave and radio frequency (RF) systems, such as mobile phone and radar systems, often include circuitry arranged to switch RF signals between different signal paths or to switch different signals alternately onto a same signal path. One example of RF switching is in a time-division duplex (TDD) system, which may be used in mobile phone communications. In such a system, received RF signals and transmission RF signals may be switched alternately onto and off of a same signal path connected to an antenna that is used to wirelessly transmit and receive communication signals.

One way to switch RF signals is to use PIN diodes in a branching circuit and bias the diodes appropriately to either pass or block RF transmission on each branch, as will be described in further detail below. The inventors have recognized and appreciated that the bias voltage required for the PIN diodes (typically more than 15 volts) is appreciably higher than voltages needed for other electronic components (e.g., buffers, logic chips, ASICs, analog-to-digital and digital-to-analog converters, processors, etc.) of signal processing circuitry in mobile phones and RF systems. This difference in required voltage can present an inconvenience for manufacturers. For example, an additional voltage supply is needed in the system to operate the PIN diodes. It is typically the responsibility of the manufacturer to provide the additional voltage supply or supplies needed for the PIN diodes and driving circuits.

The inventors have also recognized and appreciated that operation of GaN devices, which may be used in RF communication systems and radar applications, can require multiple high-voltage supplies. For example, a gate of a gallium-nitride HEMT may be reverse biased with a high negative voltage prior to and while a positive supply voltage is applied to a drain of the transistor upon power up. The negative bias can prevent an otherwise large current flow that would occur and that could damage the HEMT if the supply voltage alone were applied to the HEMT. In some cases, the negative voltage bias can be as large as −10 volts or more, and the positive voltage bias can be as large as 20 volts or more.

To avoid the inconvenience of additional power supplies, the inventors have conceived of driver circuitry that includes a regulated boost converter with multiple output voltages and bias drivers for applying the output voltages to PIN diodes or GaN devices. Voltage levels of the output voltages may be externally and dynamically programmable, so that the output voltages can be tuned to improve performance of components biased by the output voltages. According to some embodiments, the driver circuitry can be assembled on a same substrate in a single module that is powered by a single, low-voltage source (e.g., a 5-volt source). In some implementations, three bias drivers may be integrated in the module with the driver circuitry and operated by a single-bit, two-level logic signal to switch RF signals. In some cases, PIN diodes may be assembled on the same substrate, biased by the bias drivers, and configured to switch RF signals to and from an antenna line. In some embodiments, a negative voltage and a positive voltage output from the boost converter may be used to bias GaN devices, such as GaN transistors or GaN amplifiers.

FIG. 1 shows one example of programmable drive circuitry 100 for biasing PIN diodes and/or GaN devices. Most of the components, except for external passive components (e.g., inductors, capacitors, diodes, resistors), may be incorporated in a single module in some embodiments. The components may be assembled onto a substrate 105 and incorporated into a ceramic or plastic package having multiple contacts on an external surface. The contacts (e.g., pins, tabs, bumps, or pads) may be designed for making separate connections to the drive circuitry within a larger circuit or system (e.g., inserting into a printed circuit board and/or connecting with solder). The substrate 105 may be any suitable insulating substrate (e.g., formed from printed circuit board material or a ceramic) and may include a ground plane or ground interconnects.

In overview, the drive circuitry 100 may include a supply voltage contact (labeled "Vs" in the drawing) to which power may be applied to activate the drive circuitry. In some embodiments, the drive circuitry may be powered with a single source (not shown) that outputs a voltage $V_s$ between about 2.5 volts and about 7 volts and is capable of providing between about 1 amp and about 6 amps. In some embodiments, the single source may output a voltage $V_s$ between about 2.5 volts and about 7 volts and provide between about 0.1 amp and about 1 amp. The supply voltage contact Vs may connect to a voltage converter that converts the received low voltage $V_s$ to a first high voltage $V_h$ (e.g., between about 20 volts and about 35 volts) that is provided to a high-voltage contact Vh. The voltage converter may additionally convert the received low voltage to a negative voltage $V_n$, e.g., between about −8 volts and about −20 volts, that is provided to a negative-voltage contact Vn.

The high-voltage $V_h$ output from the voltage converter may be provided to a high-voltage, low-dropout regulator (HV LDO) 120, according to some embodiments, which regulates the high voltage down to a second high-voltage value $V_{reg}$. The regulated voltage may be a value between about 15 volts and about 28 volts. In some implementations, the regulated voltage from the HV LDO 120 may be provided to bias drivers 142, 144, 146, which may be controlled by signals from a transistor-transistor logic (TTL) buffer 110. In some implementations, the bias drivers may be controlled to apply a desired biasing sequence to PIN diodes for switching RF signals. In some embodiments, one or more bias drivers may be controlled to apply a supply voltage, additionally or alternatively, to one or more GaN device.

In some embodiments, the biased PIN diodes and/or GaN devices may be external to the package containing the bias drivers 142, 144, 146, e.g., assembled in a separate package. If the PIN diodes and/or GaN devices are external, biasing contacts (not shown) for connecting to the PIN diodes and/or GaN devices may be located at an external surface of the package containing the bias drivers. In some implementations, PIN diodes $D_{rx}$, $D_{tx}$, and $D_{sh}$ and/or one or more GaN devices 140 may be internal to the package containing the bias drivers, and connected together in a circuit to switch and/or amplify RF signals in a desired manner.

In further detail, a voltage converter of the drive circuitry 100 may comprise a boost converter that uses a single inductor L1 and provides multiple voltage outputs, though other types of voltage converters may be used in other embodiments. The inductor may mount external to the package and connect to inductor contacts Lp and Ln. The boost converter may comprise two or more transistors M1, M2 within the package that are configured to switch current from the supply voltage contact Vs through the inductor L1. In some embodiments, there may be two transistors of opposite type (p-FET, n-FET) connected to switch current through the inductor L1. The switching of the transistors may be controlled by a switch control circuit 180. In some implementations, the switch control 180 may comprise circuitry used for single-inductor multiple output (SIMO) converters. The switch control 180 may include two output contacts (P, N) that connect to gates of the transistors M1, M2, and also include a current-sensing contact $I_s$ that connects to a source or drain of one of the transistors M1, couples to an end of the inductor L1, and connects to current limiting circuitry with the switch control 180.

Additional components for voltage conversion may include two diodes D1, D2 and two charging capacitors C1, C2, which may be mounted external to the package and connect to boost-converter circuitry within the package via a high-voltage contact Vh and a negative-voltage contact Vn, as indicated in FIG. 1. The high-voltage contact Vh may be configured to connect to a node between a cathode of the first diode D1 and the first capacitor C1, and may also connect to a high-voltage sensing node s1 of the switch control 180. The negative-voltage contact Vn may be configured to connect to a node between an anode of the second diode D2 and the second capacitor C2, and may further connect to a negative-voltage sensing node s2 of the switch control 180. Circuitry within the switch control 180 may monitor the voltages on the capacitors C1, C2 as they are charged and discharged by the switching of transistors M1, M2, and control switch timing based in part on the detected voltages. One or more contacts r1, r2 may be included with the switch control 180 to receive programmable reference voltage values that can be compared against sensed voltage values, and used to maintain output voltages from the voltage converter at desired levels.

According to some embodiments, reference voltage values for the switch control 180 may be provided by programmable reference circuitry 160. Any suitable voltage reference circuit may be used to provide one or more DC voltage reference values. Examples of voltage reference circuits include Zener diode voltage reference circuits, resistive voltage dividers, and programmable bandgap voltage references, though other voltage reference circuits may be used. In some implementations, digital-to-analog converters (DACs) may be included to obtain reference voltage values, where a digital code is applied to obtain a desired output reference voltage. According to some embodiments, voltage reference circuits in the reference circuitry 160 may be programmed and/or activated by signals that are transmitted from a register 150. Voltage-programming signals may be transmitted upon start-up and/or while the drive circuitry is in operation. In some embodiments, voltage reference circuits in the reference circuitry 160 may be programmed directly via external data signals that are provided to the reference circuitry 160.

In some embodiments, drive circuitry 100 may include a programmable HV LDO 120 that receives the converted high voltage $V_h$ (e.g., voltage appearing at C1) from the boost voltage converter. According to some implementations, an LDO may be programmed by providing a programmable reference voltage, used by the LDO, from the register 150. The inventors have recognized and appreciated that the converted high voltage $V_h$ has spikes that result from the switching of transistors M1, M2. These spikes, if passed to the bias drivers 142, 144, 146 may couple onto and add noise to RF signals that are switched by the PIN diodes or amplified by GaN amplifiers. This noise generated by the transistors M1, M2 can degrade RF communication signals, for example.

To reduce the switching noise, the boost voltage converter may convert the input voltage $V_s$ to a voltage higher than necessary. The HV LDO 120 may then substantially remove the spikes and provide a regulated voltage at a lower, desired level that is suitable for powering the bias drivers 142, 144, 146. According to one embodiment, the boost voltage converter may boost the input supply voltage $V_s$ from a value between about 2.5 volts and about 7 volts, to about 23 volts, and the HV LDO 120 may regulate the voltage to about 19.5 volts while substantially removing switching noise from the boost converter. Other voltage values may be used in other embodiments.

According to some implementations, the HV LDO 120 may be programmed with digital data received from a register 150, while in other embodiments, the LDO may be programmed with a signal received from reference circuitry 160. The register may be included in the same package and assembled on the substrate 105. The HV LDO may include a DAC that converts the digital signal to an analog signal for use as a reference voltage. In the drawings, interconnects having a slash indicate digital data lines having more than one bit per digital word. In some cases, reference circuitry 160 may output a programmed analog voltage value to the HV LDO 120 to use as a reference voltage. An on-board oscillator 190 may be assembled on the substrate 105 (or a clock signal may be received from an external source) and used to clock data to and from the register 150 upon start-up and during operation.

The register 150 may be configured on-the-fly, prior to, or at start-up of the drive circuitry 100 via a programming contact PG. For example, digital data may be provided to the register 150 via the programming contact to alter voltage reference values provided to the HV LDO 120 and/or provided by reference circuits 160. In this manner, voltages $V_h$, $V_n$, and $V_{reg}$ may be programmed to desired non-zero values for a particular application. For example, a first set of voltages may be used for a PIN diode switching application, and a second set of voltages may be used for biasing a GaN amplifier. In some implementations, $V_h$ may be programmed to any value between about 20 volts and about 35 volts, $V_{reg}$ may be programmed to any value between about 15 volts and about 28 volts, and $V_n$ may be programmed to any value between about −8 volts and about −20 volts.

In some implementations, bias voltages may be adjusted on-the-fly to obtain better performance of a biased component. For example, a PIN diode switch may provide higher RF isolation between ports with higher reverse-bias voltages on a diode, so voltages may be increased when high isolation is needed. However, higher output voltages from the converter may cause the boost converter to operate less efficiently. When high RF isolation is not needed, voltages may be decreased to improve voltage conversion efficiency.

In some implementations, on-board logic and digital elements may operate at supply voltages lower than the supply voltage $V_s$ provided to the voltage supply contact Vs. For example, the provided supply voltage $V_s$ may be about 5 volts, and the on-board logic and digital elements may operate at 3.3 volts or as low as 1.8 volts. According to some embodiments, a second low-voltage (LV) LDO 110 may then be included with the drive circuitry 100 on the substrate 105 within the same package. The LV LDO 110 may receive the same supply voltage $V_s$ used for powering the drive circuitry 100, and output a lower voltage for digital logic. The output voltage from the LV LDO may be provided to an external contact Vdig for external use and/or monitoring.

In some embodiments, PIN diodes $D_{tx}$, $D_{rx}$, $D_{sh}$ may be assembled on the same substrate 105 and configured to switch RF "receive" and "transmit" signals onto a same antenna line, as indicated in FIG. 1. For example, an antenna line may couple to an antenna contact ANT via a coupling capacitor $C_{ant}$ and connect to an external antenna that is used to wirelessly transmit and receive RF signals. The external antenna may be an antenna of a mobile device such as a mobile phone, laptop, or tablet. The antenna line may also connect to a node between an anode of a receive diode $D_{rx}$ and an anode of a transmit diode $D_{tx}$. The receive diode may have a cathode that couples to a receive contact RX via a receive capacitor $C_{rx}$. The transmit diode may have a cathode that couples to a transmit contact TX via a transmit capacitor $C_{tx}$. In some implementations, there may be a shunt diode $D_{sh}$ that connects to a cathode of the receive diode $D_{rx}$ and to a reference voltage, such as ground.

In some cases, the PIN diode switching circuitry may further include a low-noise amplifier 140, which may comprise a GaN amplifier, having an input connected to a cathode of the receive diode $D_{rx}$ and an output coupled to the receive contact RX. The low-noise amplifier may be used to amplify RF signals received from an antenna (not shown) that is connected to the antenna contact ANT. To reduce energy consumption and/or avoid amplifier damage, the low-noise amplifier 140 may be deactivated for a period of time when signal amplification is not needed, and receive an activation or enable signal from the TTL buffer 110 when needed. For example, the low-noise amplifier may be shut off or placed in a low-power state when signals are being transmitted, and then activated just prior to changing circuit operation from a transmitting mode to a receiving mode. According to some embodiments, a time-delayed signal may be provided from the TTL buffer 110 that ensures the low-noise amplifier is not activated until after the PIN diode switches have been set to a receive mode. In some implementations, the enable signal may also be provided to an enable contact $EN_{out}$ for controlling other amplifiers or circuits that are used in combination with the PIN driver circuitry 100. In some cases, the low-noise amplifier 140 may be shut off immediately prior to switching to a next operating mode and turned on after the PIN diodes are biased in a receive mode to avoid receiving switching transition noise and spikes at the low-noise amplifier.

According to some embodiments, a transmit amplifier (not shown) may be included between the transmit contact TX and the transmit diode $D_{tx}$, or located external to the driver circuitry package. The transmit amplifier may be a high power GaN amplifier that boosts the power of a signal to be transmitted wirelessly by an antenna connected to the antenna contact ANT. The transmit amplifier may receive power and bias voltages from the Vreg and Vn contacts, and may be enabled by a signal derived from the $EN_{out}$ contact.

Biasing circuitry (indicated by dashed ovals around the PIN diodes, details not shown) may be arranged to apply bias voltages across each PIN diode junction to control the RF transmission characteristics of the diodes. Any suitable DC biasing circuitry may be used. The biasing circuitry may include biasing inductors connected to cathodes or anodes of the PIN diodes, wherein the biasing inductors are arranged to couple a DC bias onto the RF signal lines across the diode junctions. The biasing circuitry may further include capacitive shunts connected to the biasing inductors to help shunt noise and reduce coupling the noise to the signal lines.

According to some embodiments, transmit signals from the transmit contact TX may be switched onto the antenna line and to the antenna contact ANT by not biasing or reverse biasing the receive diode $D_{rx}$ and optionally forward biasing the transmit diode $D_{tx}$ and shunt diode $D_{sh}$. Received signals from the external antenna may be switched to the receive contact RX by not biasing or reverse biasing the transmit diode $D_{tx}$ and shunt diode $D_{sh}$ and optionally forward biasing the receive diode $D_{rx}$. In some implementations, a constant low-voltage forward bias may be applied to the diodes to obtain conducting states, and applied reverse biases may override the small forward bias.

When a single high-voltage supply (e.g., $V_{reg}$) is used to bias the PIN diodes, then the PIN diodes may alternate between states of reverse bias and no bias. In the above example, the shunt diode and transmit diode are biased together to be in a same state. The receive diode is biased separately to be in an opposite state.

From the foregoing description of PIN diode biasing, it may be appreciated that only two bias states are needed to connect transmit or receive signals to the antenna line. In such embodiments, a one-bit control signal (hi, lo) may be provided to the TTL buffer 110 (via a bias-control input contact TX/RX$_{in}$) to control the bias drivers and PIN diode switches when switching the RF signals.

Although three bias drivers and PIN diodes are depicted in the illustrated embodiments, fewer or more bias drivers and PIN diodes may be used in other implementations. For example, one PIN diode and bias driver may be used to pass or block a single RF signal. In some cases, one or more GaN transistors (e.g., configured as amplifiers) instead of or in addition to PIN diodes may be driven by one or more bias drivers. In some implementations, GaN devices may be assembled on the same substrate as the bias drivers. In other embodiments, the GaN devices may be on a separate substrate, e.g., packaged in a separate module, that can be electrically connected to bias driver contacts.

Figure 2:
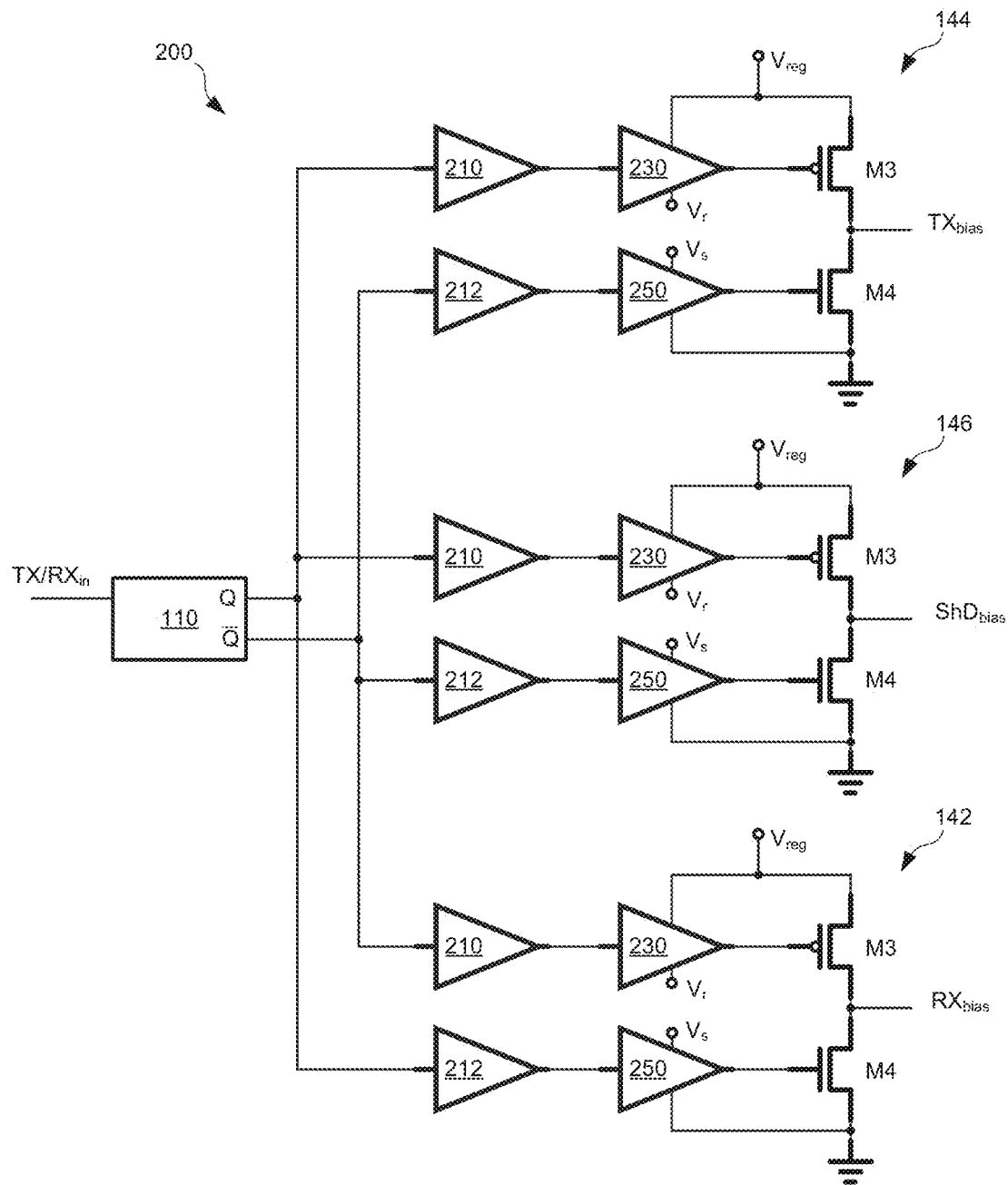
FIG. 2 depicts components of bias drivers, according to some embodiments.

FIG. 2 schematically depicts components of bias drivers 142, 144, 146, according to some embodiments. In this example, the bias drivers are arranged to bias three PIN diodes for an RF switching application. Alternative bias driver circuits may be used for other implementations, e.g., to bias one or more GaN devices. According to some embodiments, each bias driver may be configured to switch an output node TX$_{bias}$, RX$_{bias}$, ShD$_{bias}$ between the regulated voltage $V_{reg}$ output from the HV LDO 120 and a low voltage, e.g., a ground, near-ground, or other low-voltage reference potential. According to some embodiments, each bias driver may comprise a pair of level shifters 210, 212 configured to receive enable or not-enable signals from the TTL buffer 110. One branch of a bias driver may control a first transistor M3 via a first buffer 230, and a second branch of the bias driver may control a second transistor M4 via a second buffer 250. The second transistor M4 may be of opposite conductivity type than that of the first transistor M3.

In some implementations, the buffers 230, 250 may be low-voltage buffers of the same type (e.g., 5-volt buffers). However, the supply and reference voltages for each buffer may differ. For example, the first buffer 230 may be configured to drive a p-type transistor M3 that switches the high voltage $V_{reg}$ onto and off the biasing node (e.g., TX$_{bias}$). Accordingly, its supply voltage may be $V_{reg}$ and its reference voltage $V_r$ may be about 5 volts below $V_{reg}$. The reference voltage $V_r$ may be provided by a voltage reference circuit 115, referring again to FIG. 1. In some cases, the reference voltage $V_r$ and its circuit may be included in reference circuitry 160. Level shifter 210 may shift the voltage level from TTL buffer 110 to a higher value that is suitable for operating the first buffer 230.

The second buffer 250 may be configured to drive an n-type transistor M4 that switches a low voltage or ground potential onto the biasing node. The second buffer 250 may receive the supply voltage $V_s$ used for powering the driver circuitry 100, and receive a reference voltage at ground potential, for example.

Figure 3:
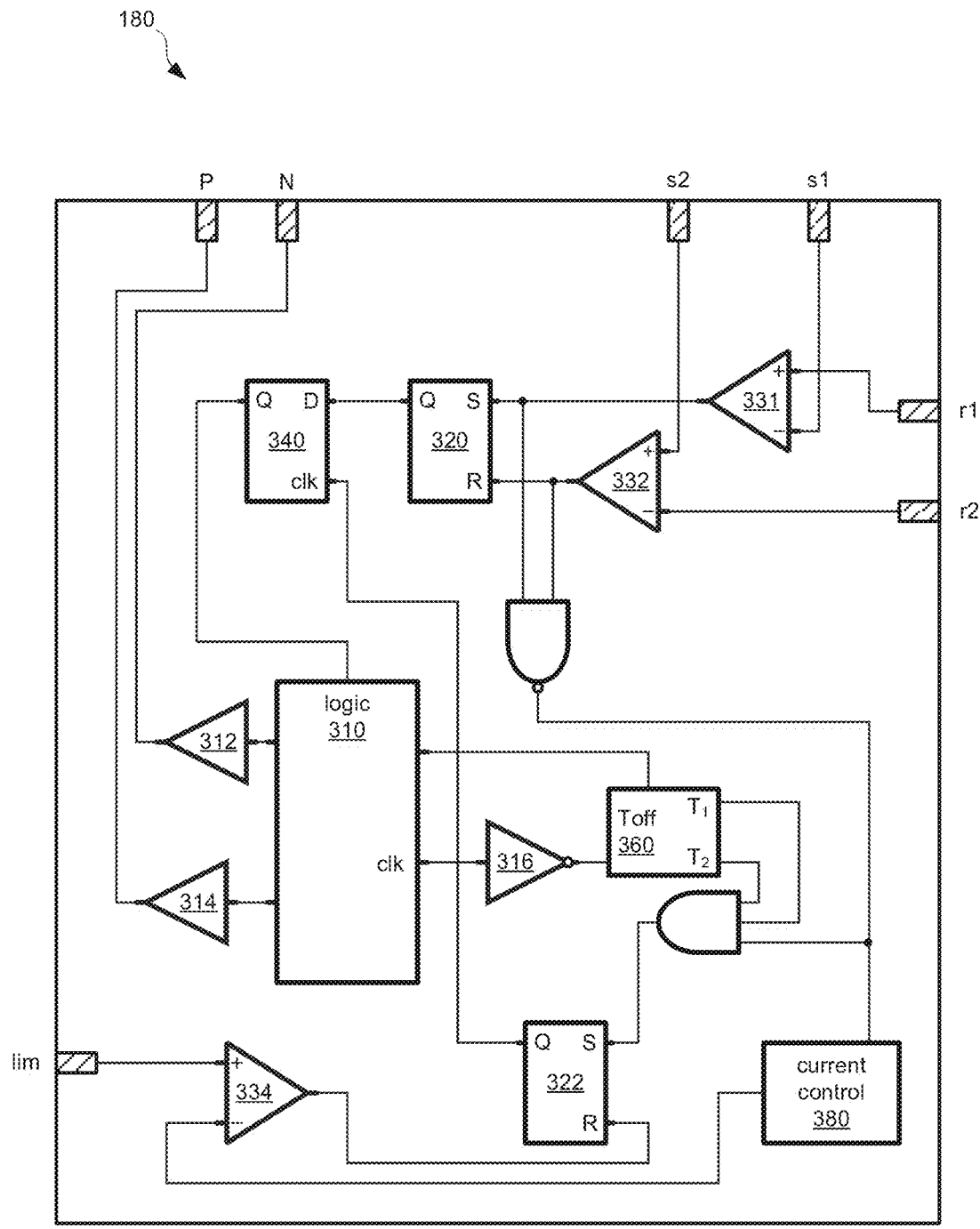
FIG. 3, depicts components of a switch control circuit for a single-inductor boost converter, according to some embodiments.

Some components of the switch control 180 are depicted in FIG. 3, according to some embodiments. In some implementations, the switch control 180 may utilize current-limit control and combine aspects of pulse width modulation (PWM) and pulse frequency modulation (PFM) to determine when to drive current through the inductor L1. In PWM, a first comparator 331 senses the high voltage output from the boost converter (appearing across capacitor C1, referring to FIG. 1), and sets a status signal at a first resettable latch 320. A negative-voltage crossing (appearing across capacitor C2) sensed via the negative-voltage contact Vn and compared with a second comparator 332 determines when the first latch 320 is reset. An internal clock circuit, comprising a second latch 322, a clocked flip-flop 340, and a selectable off-period circuit 360 may receive a clock signal from central logic 310 of the switch control 180 and receive inputs from AND gates indicating the voltage status on the boost converter outputs and current level applied to the inductor L1. The internal clock may have a variable period or frequency. According to some embodiments, the central logic 310 may select a first off-period $T_1$ of the internal clock and drive output buffers 312, 314 (which drive gates of transistors M1, M2) using the first off-period $T_1$ until the sensed high-voltage reaches a first threshold value. Then the central logic 310 may select a second off-period $T_2$ at which to alternatingly apply voltage across the inductor L1 until the current in the inductor reaches a first threshold value. Subsequently, the central logic 310 may select the first off-period $T_1$ for allowing current to dissipate from the inductor L1, and the cycle of applying and dissipating current from the inductor may be repeated using two different off-periods. Circuitry for sensing current in the inductor and comparing against threshold values may include current control circuitry 380 that outputs a reference voltage value to a third comparator 334. The third comparator may receive an input from a current limit contact (labeled "$I_s$" in the drawing) that connects to an end of the inductor L1.

Methods for biasing RF components, such as PIN diodes and/or GaN devices, using the above-described circuits may also be implemented. For example, a method for biasing RF components with a driver circuit assembled on a substrate may comprise acts of receiving, at the driver circuit, a first supply voltage, converting, with a boost converter assembled on the substrate, the first supply voltage to a second voltage that is greater than the first voltage, and converting, with the boost converter, the first supply voltage to a third voltage that is less than the first voltage. A method for biasing RF components may further include acts of reducing, with a low-dropout regulator assembled on the substrate, the second voltage to a fourth voltage and providing the fourth voltage to one or more bias drivers that are assembled on the substrate. A method may also include acts of receiving, at a programmable register assembled on the substrate, a digital signal, and altering the fourth voltage from a first value to a second value within a positive voltage range that is greater than zero volts. The altering of the fourth voltage may be done in response to receiving the digital signal and by issuing a control signal from the programmable register.

A method for biasing a GaN transistor or amplifier may comprise acts of applying a negative voltage $V_n$ from a negative voltage contact to a gate of a GaN transistor (e.g., a GaN HEMT), and then applying a high voltage from the HV LDO to a drain of the transistor.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A driver circuit comprising:
   a substrate on which the driver circuit is assembled;
   a supply voltage contact configured to receive electrical power from a power source;
   a boost converter connected to the supply voltage contact and configured to convert a first voltage received from the power source to a second voltage that is greater than the first voltage and to a third voltage that is less than the first voltage;
   a low-dropout regulator configured to convert the second voltage to a fourth voltage; and
   a programmable register configured to receive a digital signal and output a first control signal responsive to the received digital signal that alters at least the fourth voltage within a positive voltage range that is greater than zero volts.

2. The driver circuit of claim 1, wherein the positive voltage range is from approximately 15 volts to approximately 28 volts.

3. The driver circuit of claim 1, wherein the programmable register is further configured to output a second control signal that alters the third voltage within a negative voltage range that is less than zero volts.

4. The driver circuit of claim 3, wherein the negative voltage range is from approximately −8 volts to approximately −20 volts.

5. The driver circuit of claim 1, wherein the supply voltage contact is the only contact for receiving power that powers the driver circuit.

6. The driver circuit of claim 1, wherein the boost converter comprises:
   two transistors;
   two inductor contacts on the substrate that are connected to the two transistors; and
   switching circuitry configured to switch current through an inductor that attaches to the two inductor contacts.

7. The driver circuit of claim 6, wherein an input of the low-dropout regulator is arranged to connect to a cathode of a diode having an anode that connects to the inductor.

8. The driver circuit of claim 1, wherein the first voltage is between approximately 2.5 volts and approximately 7 volts.

9. The driver circuit of claim 8, wherein the fourth voltage is less than the second voltage.

10. The driver circuit of claim 1, further comprising one or more bias drivers configured to receive a supply voltage from the low-dropout regulator and switch output bias voltages between two levels.

11. The driver circuit of claim 10, further comprising a TTL buffer configured to receive commands via a bias-control contact and activate or deactivate the one or more bias drivers.

12. The driver circuit of claim 11, wherein the TTL buffer is further configured to output an enable signal that indicates when at least one of the bias drivers is activated or deactivated.

13. The driver circuit of claim 10, wherein a bias driver of the one or more bias drivers comprises:
   a first transistor having a drain connected to receive an output voltage from the low-dropout regulator;
   a first buffer configured to receive power from the low-dropout regulator, to be referenced to a reference voltage that is less than a voltage from the low-dropout regulator and greater than zero volts, and to drive a gate of the first transistor;
   a second transistor having a drain connected to a source of the first transistor; and a
   second buffer configured to drive a gate of the second transistor.

14. The driver circuit of claim 13, wherein the reference voltage is between 2.5 volts and 7 volts less than a voltage received from the low-dropout regulator.

15. The driver circuit of claim 13, further comprising:
a first level shifter having an output connected to an input of the first buffer; and
a second level shifter having an output connected to an input of the second buffer.

16. The driver circuit of claim 10, further comprising plural PIN diodes assembled on the substrate and connected to the one or more bias drivers.

17. The driver circuit of claim 16, further comprising:
an antenna contact coupled to a node between a receive PIN diode and a transmit PIN diode of the plural PIN diodes;
a receive contact coupled to a node between the receive PIN diode and a shunt PIN diode of the plural PIN diodes; and
a transmit contact coupled to the transmit PIN diode, wherein the bias drivers are configured to bias the plural PIN diodes to switch RF signals between the receive contact and the transmit contact from or to the antenna contact.

18. The driver circuit of claim 17, further comprising a low noise amplifier assembled on the substrate and connected to receive a signal from a cathode of the receive PIN diode and output an amplified signal to the receive contact.

19. The driver circuit of claim 10, further comprising one or more gallium-nitride devices assembled on the substrate and connected to the one or more bias drivers.

20. The driver circuit of claim 19, wherein a gallium-nitride amplifier of the one or more gallium-nitride devices is arranged to receive a negative voltage bias from the third voltage.

* * * * *